United States Patent [19]

Nara et al.

[11] Patent Number: 5,523,841
[45] Date of Patent: Jun. 4, 1996

[54] DISTANCE MEASURING APPARATUS USING MULTIPLE SWITCHED INTERFEROMETERS

[75] Inventors: Kei Nara, Yokohama; Toshio Matsuura, Tokyo, both of Japan

[73] Assignee: Nikon Corporation, Tokyo, Japan

[21] Appl. No.: 357,090

[22] Filed: Dec. 15, 1994

Related U.S. Application Data

[63] Continuation of Ser. No. 105,931, Aug. 13, 1993, abandoned.

[30] Foreign Application Priority Data

Aug. 18, 1992 [JP] Japan ..................... 4-242677

[51] Int. Cl.⁶ ............................................... G01B 9/02
[52] U.S. Cl. .................................... 356/358; 356/363
[58] Field of Search .................... 356/358, 363, 356/349, 351, 356

[56] References Cited

U.S. PATENT DOCUMENTS

| | | | |
|---|---|---|---|
| 4,666,273 | 5/1987 | Shimizu et al. | 353/101 |
| 4,770,531 | 9/1988 | Tanaka et al. | 356/358 |
| 4,998,789 | 3/1991 | Ishizuka et al. | 356/256 |
| 5,114,234 | 5/1992 | Otsuka et al. | 356/358 |

*Primary Examiner*—Samuel A. Turner
*Attorney, Agent, or Firm*—Shapiro and Shapiro

[57] ABSTRACT

A plurality of interference length (distance) measuring means which are opposed to a movable mirror are aligned in the direction in which said movable mirror moves at an interval narrower than the length of the mirror surface. These interference length measuring means are switched according to movement of the movable mirror. Thus, the range within which distances from the mirror surface are measured can be made wider than the length of the mirror surface of the movable mirror.

12 Claims, 5 Drawing Sheets

DISTANCE MEASURING APPARATUS USING MULTIPLE SWITCHED INTERFEROMETERS

This is a continuation of application Ser. No. 08/105,931 filed Aug. 13, 1993, now abandoned.

BACKGROUND OF THE INVENTION

1. Field of the Invention

The present invention relates to a distance measuring apparatus. More specifically, the present invention is preferably applied to a distance measuring apparatus provided in an apparatus which is required to have high precision in positioning; for example, a sample stage of a projection exposure apparatus.

2. Related Background Art

Conventionally, in a projection exposure apparatus for manufacturing semiconductor circuits or liquid crystal devices, a plurality of exposed regions (circuit pattern formation regions) which are arranged in a matrix on a photosensitive substrate (a semi-conductor wafer or a glass plate on which a resist layer is formed) are exposed in sequence through patterns of a plurality of corresponding masks (reticles) to light by means of a projection optical system in order to transfer and overlap said patterns onto the exposed regions.

Positioning (i.e. alignment) of the projected images of said plurality of reticle patterns is usually performed by irradiating marks for alignment formed on the reticles and marks for alignment formed on the substrate with illuminating light and determining the amount of relative divergence therebetween. In this case, in order to detect the position of a movable stage (plate stage) on which the substrate is mounted, length measuring devices of laser beam interference type (hereinafter referred as interferometers) which utilize laser beams are employed (FIG. 8).

More specifically, a projection exposure apparatus 1 is provided with interferometers 3 and 4 which are arranged in a plane parallel with a mount surface 2A of an XY-stage 2 on which a substrate is mounted, wherein optical axes of the interferometers are orthogonal so that the interferometers 3 and 4 measure the shifting amounts in the X-axis direction and the Y-axis direction, respectively.

The interferometer 3 comprises a fixed mirror 5 fixed to an immobile part of the XY-stage 2, a movable mirror 7 fixed to a movable part (of the XY-stage 2) and a beamsplitter 9. Similarly, the interferometer 4 comprises a fixed mirror 6, a movable mirror 8 and a beamsplitter 10. The shifting amount in the X-axis direction is constantly measured on the basis of interference between light reflected by the fixed mirror 5 and light reflected by the movable mirror 7. Similarly, the shifting amount in Y-axis direction is constantly measured on the basis of interference between light reflected by the fixed mirror 6 and light reflected by the movable mirror 8.

The movable mirrors 7 and 8 have to be constantly illuminated with laser beams to measure the shifting amounts of the XY-stage 2 in the X-axis direction and the Y-axis direction by means of the interferometers 3 and 4.

Therefore, the area within which the XY-stage can move should be narrower than the lengths of the movable mirrors 7 and 8.

More specifically, the movable range in the X-axis direction is limited to the length lx of the movable mirror 7 or less, and the movable range in the Y-axis direction is limited to the length ly of the movable mirror 8 or less.

Accordingly, the lengths of the movable mirrors 7 and 8 should be made greater to enlarge the area in which the XY-stage can move. It is difficult, however, to work a surface of a large movable mirror with high precision or to manufacture such a large movable mirror. So, an XY-stage 2 of this kind of apparatus which can move within a large movable range has not been manufactured.

SUMMARY OF THE INVENTION

The above-mentioned aspects being considered, the present invention was made, and its object is to provide a distance measuring apparatus which can enlarge the area within which the XY-stage 2 moves without enlarging dimensions of the movable mirrors in proportion to said XY-stage movable area.

In order to achieve the above object, according to the first aspect of the present invention, a distance measuring apparatus has length (distance) measuring means for irradiating reflecting surfaces of movable mirrors with light beams and measuring distances from the movable mirrors on the basis of reflected light beams, wherein:, as shown in FIG. 1 one movable mirror 8 has a reflecting surface along the direction in which the movable mirror 8 moves (i.e. along the X-axis direction); the reflecting surface is shorter than the range within which the movable mirror 8 moves; a plurality of length distance measuring means 12, 13 and 14 are aligned in the moving direction of the movable mirror 8 (X-axis direction) at intervals narrower than the length of the reflecting surface; at least one of said plurality of length measuring means 12, 13 and 14 irradiates the reflecting surface of the movable mirror 8 with a light beam; and the distance is measured on the basis of the result of measurement made by at least one of said length measuring means 12, 13 and 14.

According to the second aspect of the present invention, as shown in FIGS. 1 and 3A–3C, a plurality of movable mirrors 23 and 24 are arranged in the direction in which the movable mirrors move (i.e. in the X-axis direction) at an interval d2 which is narrower than an interval d3 between a plurality of length measuring means 12 and 13, wherein at least one of said plurality of length measuring means 12 and 13 constantly irradiates at least one of said plurality of movable mirrors 23 and 24 with a light beam.

According to the third aspect of the present invention, a distance measuring apparatus has length measuring means for irradiating reflecting surfaces of movable mirrors with light beams and measuring distances from the movable mirrors on the basis of reflected light beams, wherein, as shown in FIG. 4, a plurality of movable mirrors 23, 24 and 25 are arranged in a plane (XY-plane) vertical to the distance measurement direction (Z-axis direction) so that the movable mirrors are aligned in the direction in which they move (X-axis direction) and that at least adjacent end portions of reflecting surfaces of the movable mirrors are overlapped with each other; a plurality of length measuring means 12 and 13 are arranged in a plane (XY-plane) so that the length measuring means are aligned in the direction (Y-axis direction) vertical to the movable direction (X-axis direction); at least one of said plurality of length measuring means 12 and 13 irradiates a reflecting surface of one of the movable mirrors 23, 24 and 25 with a light beam; and the distance is measured on the basis of the result of measurement made by at least one of said length measuring means 12 and 13.

According to the fourth aspect of the present invention, as shown in FIG. 5, each of said plurality of length measuring means irradiates a reflecting surface of one of the movable mirror 23, 24 and 25 with a plurality of light beams; that is, either with a plurality of light beams B1L and B1R or with a plurality of light beams B2L and B2R. In this case, rotation amount detecting means 31 and 32 for determining the amounts of rotation of the movable mirrors 23, 24 and 25 are provided in the apparatus.

According to the fifth aspect of the present invention, when the plurality of length measuring means 12 and 13 irradiate the reflecting surface(s) at the same time with light beams while the movable mirrors 23, 24 and 25 are moving, the result of length measurement made by one of said plurality of length measuring means 12 and 13 is replaced by the result of measurement made by the other of the two, which is corrected on the basis of the difference between the results of measurement made by the plurality of length measuring means 12 and 13.

In this embodiment, the length measuring means 12, 13 and 14 for irradiating the movable mirror 8 with light beams and measuring distances from the movable mirror 8 are arranged at intervals narrower than the length of the reflecting surface of the movable mirror, and at least one of the length measuring means 12, 13 and 14 actually irradiates the movable mirror 8 with a light beam and measures the distance from the movable mirror 8. Therefore, the range within which the movable mirror 8 moves can be made longer than the length of the reflecting surface.

In another case, a plurality of movable mirrors 23 and 24 are arranged at the interval d2 which is narrower than the interval d3 between the length measuring means 12 and 13 arranged in the movable direction (X-axis direction), and at least one of said plurality of length measuring means 12 and 13 irradiates at least one of the movable mirrors 23 and 24. Therefore, the range within which the movable mirrors 23 and 24 move can be made longer than the length of the reflecting surfaces.

In still another case, length measuring means 31, 32 which comprise respective rotation amount detecting means for irradiating the reflecting surfaces of the movable mirrors. 23 and 24 with a plurality of light beams B1L and B1R, and with a plurality of light beams B2L and B2R, respectively, and measuring the rotation amounts θ of the movable mirrors 23 and 24 are arranged at an interval narrower than the lengths of the reflecting mirrors. And at least one of these length measuring means 31, 32 actually irradiates at least one of the movable mirrors 23 and 24. Thus, the range within which the rotation amounts of the movable mirrors can be measured can be made longer than the lengths of the reflecting surfaces.

As described above, according to the present invention, the distances from the movable mirrors and the rotation amounts of the movable mirrors can be measured within a range wider than the lengths of the reflecting surfaces of the movable mirrors.

DESCRIPTION OF THE PREFERRED EMBODIMENTS (1) First Embodiment

Figure 1:
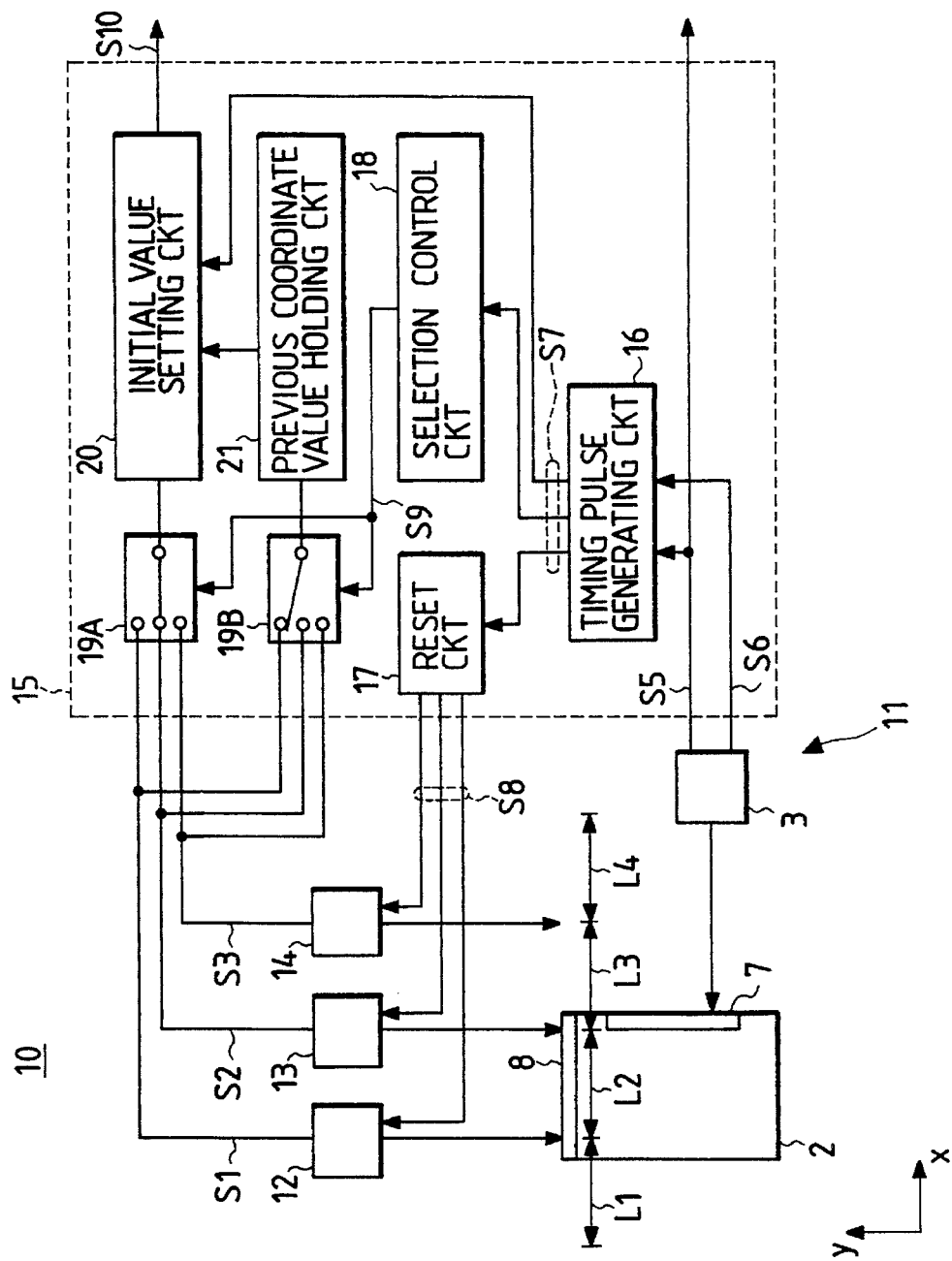
FIG. 1 is a diagram schematically showing the constitution of the distance measuring apparatus according to the first embodiment of the present invention.
Figure 8:
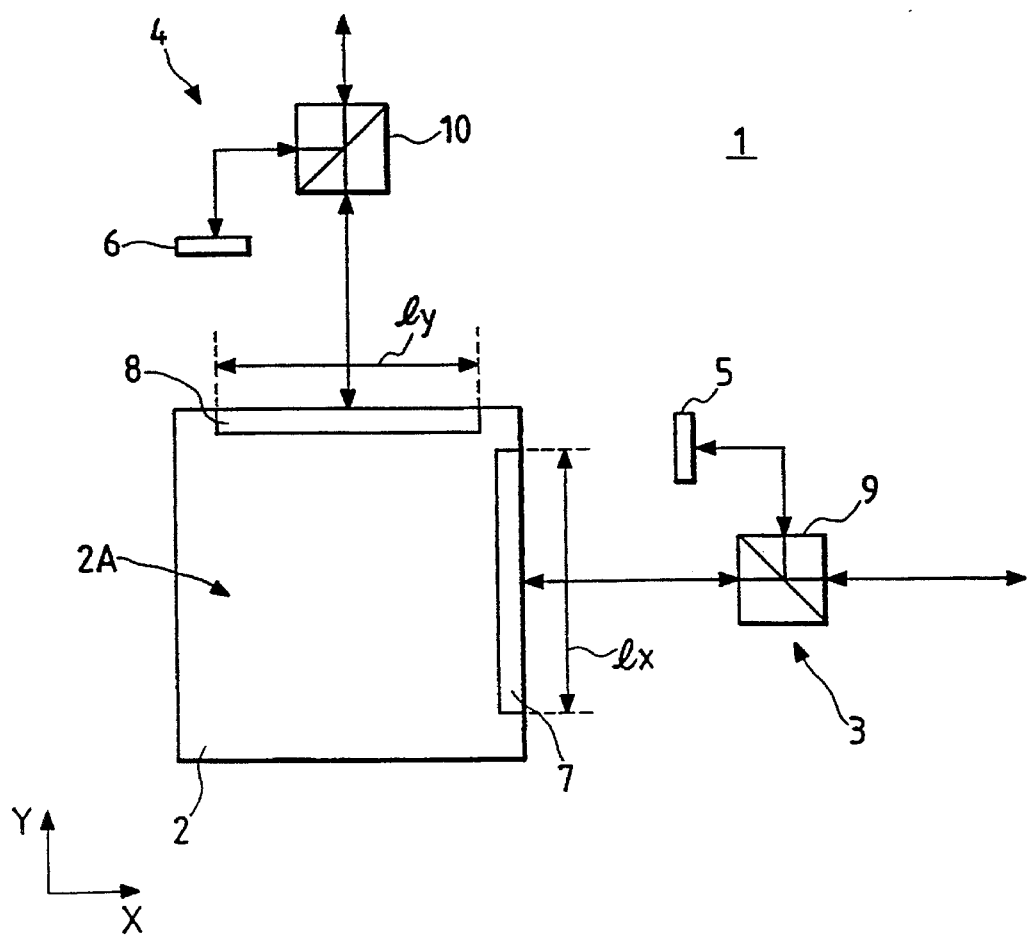
FIG. 8 is a diagram schematically showing the constitution of a conventional distance measuring apparatus.

In FIG. 1, respective portions corresponding to those in FIG. 8 are indicated by the same reference numerals, where a projection exposure apparatus have a distance measuring apparatus 11 for constantly measuring the position of an XY-stage 2 on which a substrate is mounted.

The distance measuring apparatus 11 comprises: a set of three interferometers 12, 13 and 14 for measuring Y-axis coordinate values on the basis of reflected light reflected from a reflecting mirror 8 which moves together with the XY-stage 2; and a control circuit 15 for controlling and switching these interferometers on the basis of the result of measurement made by an interferometer 3 for measuring an X-axis coordinate value.

This set of three interferometers 12, 13 and 14 for measuring the Y-axis coordinate values are arranged in the X-axis direction at intervals a little narrower than the length of the reflecting surface of the movable mirror 8 so that one of the interferometers irradiates the movable mirror 8 with a laser beam.

Here, the intervals between the laser beams emitted from respective interferometers 12, 13 and 14 is defined as L, and the measurement range is divided by L into sections, which are referred as L1, L2, L3 and L4, respectively, in this order. Accordingly, the interferometer 12 is opposed to the movable mirror 8 when the movable mirror 8 is in the sections L1 and L2, the interferometer 13 is opposed to the movable mirror 8 in the sections L2 and L3, and the interferometer 14 is opposed to the movable mirror 8 in the sections L3 and L4. The results of measurement (coordinate values) made by respective interferometers are applied to the control circuit 15 as measurement data S1, S2 and S3, respectively.

An X-axis measurement datum S5 and a movable direction datum S6 are input to a timing pulse generating circuit 16 in the control circuit 15, which outputs a timing pulse S7 for controlling switching of the interferometers 12, 13 and 14 and initial setting of the measurement data.

When a reset circuit 17 detects the fact that the XY-stage moves to a position where laser beams emitted from the adjacent interferometers 12 and 13 (or, interferometers 13 and 14) are incident on the movable mirror 8 at the same time on the basis of the timing pulse S7, reset signals S8 output from the reset circuit 17 are applied to the interferometers 12, 13 and 14 in order to stop measurement performed by the interferometer that has been in operation as well as start measurement performed by an adjacent interferometer.

When a selection control circuit 18 detects the fact that the XY-stage 2 moves to a position at which the interferometers are exchanged according to the timing pulse input from the timing pulse generating circuit 16, selection signals S9 output from the selection control circuit 18 are applied to input switching circuits 19A and 19B in order to switch input terminals of the input switching circuit 19A to apply the result of measurement made by an interferometer adjacent to the interferometer that has been in operation to a coordinate value initial setting circuit 20, as well as in order to switch input terminals of the input switching circuit 19B to apply the result of measurement made by the interferometer that has been in operation to a previous coordinate value holding circuit 21.

The coordinate initial setting circuit 20 initializes the measurement data according to the previous measurement data applied from the previous coordinate value holding circuit 21 on the basis of the timing pulse S7, and continues measurement on the basis of measurement data applied from the newly-switched-on interferometer to output it as Y-axis-measurement data S10.

In the above-mentioned constitution, in case that the XY-stage 2 moves in the X-axis direction (i.e. rightwards in the figure), when the distance measuring apparatus 11 detects the fact that the movable mirror 8 for Y-axis measurement of the XY-stage 2 is positioned in sections L1 and L2 on the basis of the X-axis measurement data S5 and the moving direction data S6 output from the interferometer 3, the interferometer 12 irradiates the movable mirror 8 for Y-axis measurement with a laser beam and measures the Y-axis-coordinate values.

Then, when the XY-stage 2 further moves rightwards and the fact that it moves to a position where the laser beam from the interferometer 12 is incident on the left end portion of the movable mirror 8 and the laser beam from the interferometer 13 is incident on the right end portion of the movable mirror 8 is detected, the control circuit 15 sends a reset signal S8 to the interferometer 13 in order to switch from Y-axis coordinate value measurement made by the interferometer 12 to Y-axis coordinate value measurement made by the interferometer 13, as well as set the Y-axis coordinate value measured by the interferometer 12 as an initial value of the interferometer 14.

On the contrary, in case that the XY-stage moves in the opposite direction, that is, leftwards, when the control circuit 15 in the distance measuring apparatus 11 detects the fact that the XY-stage 2 moves to a position where the laser beam emitted from the interferometer 13 (or 12) which is adjacent from leftward to the interferometer 14 (or 13) which is in operation is incident on the left end portion of the movable mirror 8, measurement of the Y-axis coordinate values is continued by switching interferometers adjacent to each other, which is done similarly as described above.

In the above-mentioned constitution, a set of three interferometers 12, 13 and 14 for measuring the Y-axis coordinate values are arranged in the X-axis direction at intervals a little narrower than the length of the movable mirror 8, and these interferometers are switched to be used for measurement of the Y-axis coordinate values according to the position of the XY-stage. Thus the measurable range within which the XY-stage moves can be enlarged to be substantially four times as large as the length of the reflecting surface of the movable mirror 8.

(2) Second Embodiment

Figure 2:
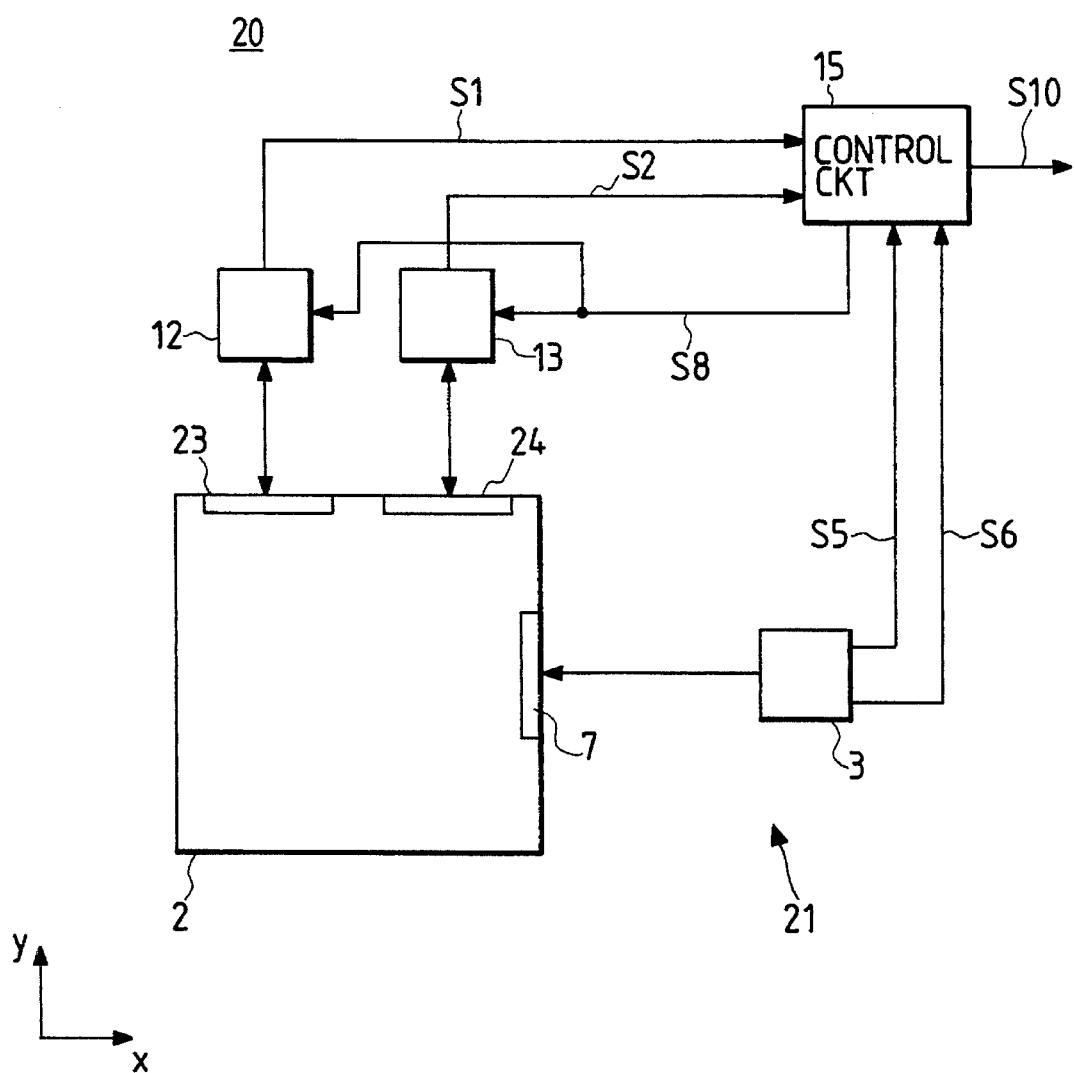
FIG. 2 is a diagram schematically showing the constitution of the distance measuring apparatus according to the second embodiment of the present invention.

In FIG. 2, respective portions corresponding to those in FIG. 1 are indicated by the same reference numerals. In a projection exposure apparatus, which is generally designated as 20, a distance measuring apparatus 21 is used to constantly measure the position of an XY-stage 2.

In this embodiment, two movable mirrors 23 and 24 for measurement of Y-axis coordinate values are provided in the XY-stage 2 at a predetermined interval, wherein the distance measuring apparatus 21 measures Y-coordinate values of the XY-stage 2 by means of interferometers 12 and 13 which are provided at positions opposed to said movable mirrors 23 and 24, respectively, and measures X-coordinate values by means of an interferometer 3 which is provided so as to be opposed to a movable mirror 7.

Figure 3A:
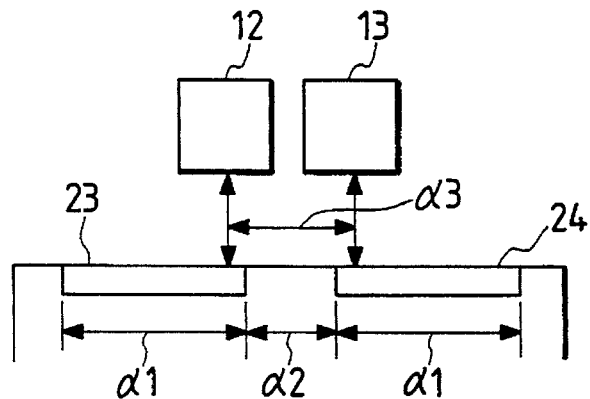
FIGS. 3A to 3C are views schematically showing light paths, explaining the operation of the distance measuring apparatus shown in FIG. 2.

Said two movable mirrors 23 and 24, and the interferometers 12 and 13 are positioned, as shown in FIG. 3A so as to satisfy the following inequality:

$$d1 > d3 > d2 \qquad (1)$$

wherein d1: the lengths of the reflecting surface of the movable mirrors 23 and 24, d2: the distance (interval) between the adjacent movable mirrors, and d3: the interval between the interferometers. Accordingly, at least one of the interferometers 12 and 13 is constantly opposed to the movable mirror 23 or the movable mirror 24.

In the above-mentioned constitution, in case that the XY-stage 2 moves from the left to the right, when the fact that the XY-stage moves to a position where the laser beam emitted from the interferometer 13 which is set on the XY-stage 2 is incident on the left end portion of the movable mirror 24 and the laser beam emitted from the interferometer 12 is incident on the right end portion of the movable mirror 23 as shown in FIG. 3A, the control circuit 15 outputs reset signals S8 to the interferometers 12 and 13 to switch to measurement by the interferometer 12. At the same time, movable mirrors are switched so that the movable mirror 23 is used for measurement.

Figure 3B:
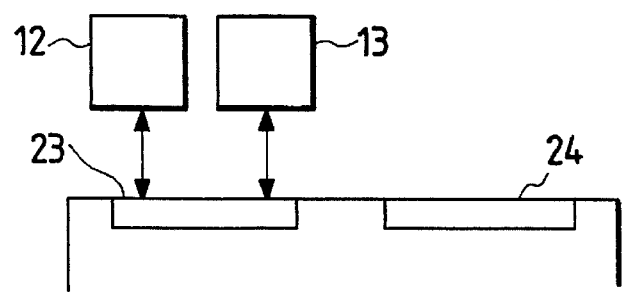
Figure 3C:
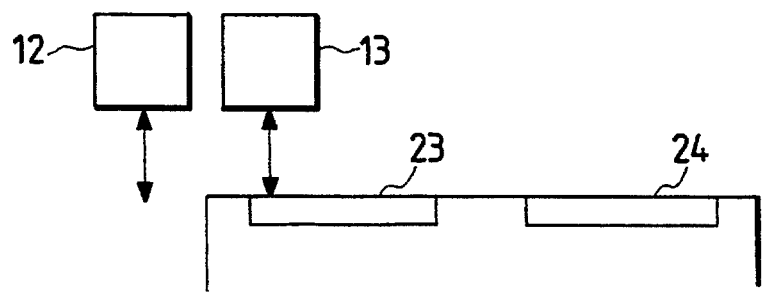

Subsequently, the distance measuring apparatus 21 continues measurement of Y-axis coordinate values by means of the interferometer 12 until the fact that the XY-stage 2 farther moves rightward to a position where the laser beam from the interferometer 12 is incident on the left end portion of the movable mirror 23 and the laser beam emitted from the interferometer 13 is incident on the right end portion of the same movable mirror 23 is detected (see FIG. 3B). This time, contrary to the above-mentioned operation, measurement by the interferometer 12 is stopped and switched to measurement by the interferometer 13, which continues measurement until the XY-stage moves to a position where the laser beam emitted from the interferometer 13 is incident on the left end portion of the movable mirror 23 (see FIG. 3C).

In the above-mentioned constitution, two movable mirrors 23 and 24 are provided to the XY-stage 2 at a predetermined interval d2, and a pair of interferometers 12 and 13 for measurement of Y-coordinate values are arranged in the X-axis direction at an interval d3, which is narrower than the lengths d1 of the reflecting surfaces of the movable mirrors 23 and 24 and wider than the interval d2 between the movable mirrors 23 and 24, wherein the interferometers and the movable mirrors used for measurement of the Y-axis coordinate values are alternately switched according to the position of the XY-stage. Thus, the measurable range within which the XY-stage moves can be further elongated with respect to the lengths of the reflecting surfaces of the movable mirrors 23 and 24.

(3) Other Embodiments

In the above-mentioned first embodiment, when measurement of the Y-axis, coordinate values made by the interferometer which has been in operation is switched to measurement made by the adjacent interferometer, the measured value obtained by the interferometer which has been in operation is used as the initial value which is set at the time of switching operation. But, the present invention is not limited to said procedure. The difference of a newly measured value from the value measured by the interferometer which has been in operation (that is, the difference between values measured by the respective interferometers) may be added to the value measured by the interferometer which now comes into operation. Otherwise, an offset value calculated by software and the like may be added thereto.

Also, in the above-mentioned first embodiment, a set of three interferometers 12, 13 and 14 are provided which correspond to one movable mirror 8. But, the present invention is not limited to this constitution. A pair of interferometers may be provided according to the range within which the XY-stage 2 moves and the length of the movable mirror 8. Or, a set of four or more interferometers may be provided.

In the above-mentioned first embodiment, the present invention is applied to enlarge the measurement range of the Y-axis coordinate values. But the application of the present invention is not limited thereto. The present invention may be further utilized to enlarge the measurement range of the X-axis coordinate values, wherein a plurality of interferometers are provided at positions opposed to the movable mirror 7 and are switched to be used.

In the above-mentioned second embodiment, two mirrors which are used for measurement of the distances in the Y-axis direction are provided to the XY-stage 2. But, the present invention is not limited to said constitution. The measurable range within which the XY-stage 2 moves may be further enlarged by aligning as many movable mirrors as necessary and alternately switching the interferometers 12 and 13; 13→12→13 . . . →12.

In the above-mentioned second embodiment, a pair of the interferometers are used to measure the Y-axis coordinate values. But the present invention is not limited to this constitution. A set of three or more interferometers may be switched to carry out measurement.

Figure 4:
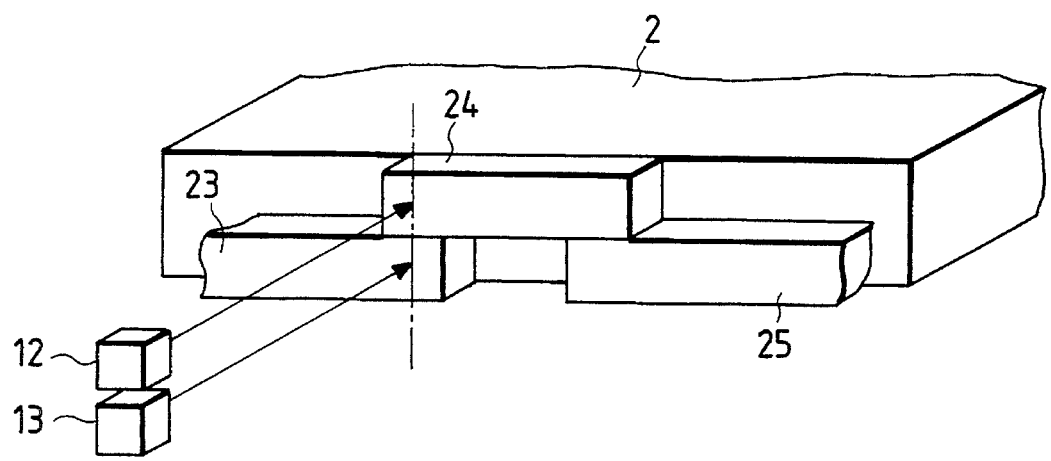
FIG. 4 is a perspective view schematically showing the configuration of another embodiment.

In the above-mentioned second embodiment, two movable mirrors 23 and 24 are arranged in the X-axis direction at the predetermined interval d2 (>0), while the pair of the interferometers 12 and 13 at the predetermined interval d3 (>0). But, the present invention is not limited to said constitution. As shown in FIG. 4, movable mirrors 23, 24 and 25 may be arranged to be double-level: that is, alternately, the movable mirror 23 in the lower row, the movable mirror 24 in the upper row, and the movable mirror 25 in the lower row. At this time, the movable mirrors are arranged so that adjacent end portions overlap with each other (d2<0), and the interferometers 12 and 13 are aligned in the Z-axis direction (d3=0).

In this case, the interferometers may be switched when the XY-stage moves to a position where laser beams emitted from the pair of interferometers 12 and 13 are both incident on respective movable mirrors at the same time. As the positions measured by the interferometers are always aligned along the same axis, the Abbe's measurement condition can be always satisfied.

In the above-mentioned embodiment, each interferometer irradiates the movable mirrors with one laser beam and measures the distance from the movable reflecting surfaces on the basis of interference between the reflected light beam reflected by the fixed mirror and the reflected light beam reflected by said movable reflecting surfaces. But the present invention is not limited to said constitution. The present invention can be also applied to measurement of the rotation angle θ of the stage by employing differential interferometers (hereinafter referred as θ interferometers) for measuring rotation angles θ of the reflecting surfaces on the basis of interference between two laser beams reflected by the movable reflecting surfaces.

Figure 5:
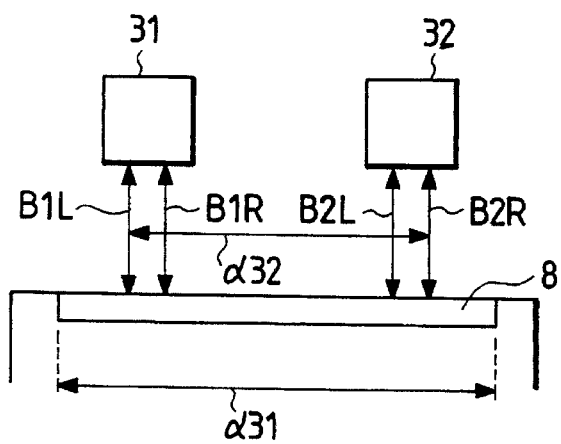
FIG. 5 is a view schematically showing the constitution of another embodiment employing θ interferometers.

For example, if such θ interferometers are employed in the first embodiment, interferometers 31 and 32 which emit a pair of laser beams B1L and B1R, and a pair of laser beams B2L and B2R, respectively, are located so that the distance d32 between the outer beams B1L and B2R is narrower than the length d31 of the movable mirror 8, as shown in FIG. 5. Thus, the measurable range can be longer than the case in which the rotation angles θ are measured by only one interferometer.

Figure 6:
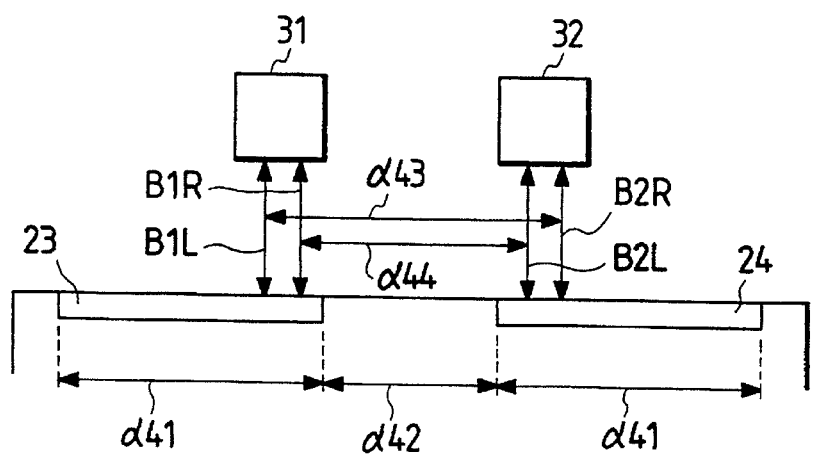
FIG. 6 is a view schematically showing the constitution of still another embodiment employing θ interferometers.

If the θ interferometers are employed in the second embodiment, as shown in FIG. 6, a plurality of interferometers 31 and 32 are arranged to be opposed to the plurality of movable mirrors 23 and 24 so that the following inequality is satisfied:

$$d41 > d43 > d44 > d42 \quad (2)$$

wherein d41: the lengths of the reflecting surfaces of the movable mirrors 23 and 24, d42: the distance between the movable mirrors 23 and 24, d43: the distance between the outer laser beams B1L and B2R of the laser beams emitted from the interferometers 31 and 32, and d44: the distance between the inner laser beams B1R and B2L. Thus, the measurable range within which the XY-stage moves can be further elongated.

Figure 7:
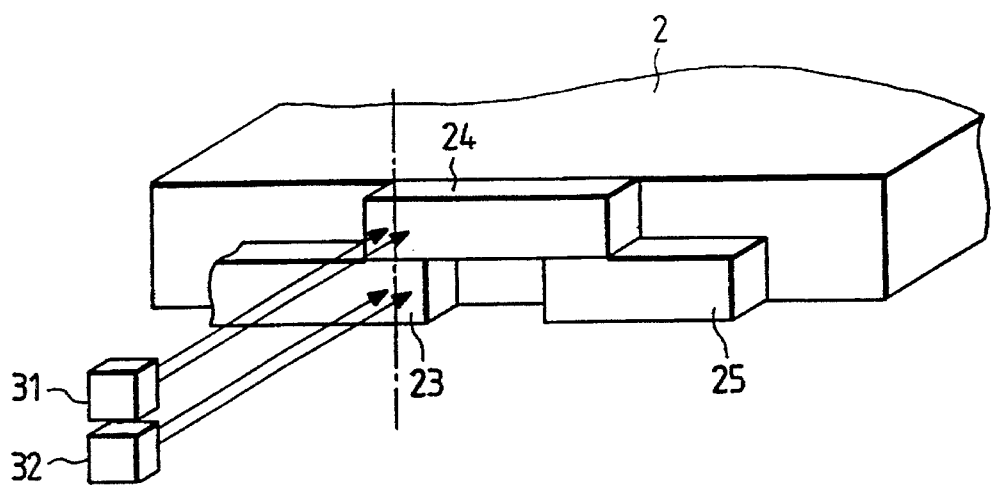
FIG. 7 is a perspective view schematically showing the configuration of still another embodiment employing θ interferometers.

If θ interferometers are employed in the distance measuring apparatus shown in FIG. 4, θ interferometers 31 and 32 are aligned along the same axis so as to be double-level, as shown in FIG. 7. Accordingly, the Abbe's measurement condition can be satisfied, and measurement of the rotation angles θ can be realized over a still wider range by increasing the number of combined movable mirrors.

In the above-mentioned embodiments, the present invention is applied to measurement of the coordinates of the XY-stage 2 in the projection exposure apparatus. But the application of the present invention is not limited thereto. The present invention can be applied to various kinds of distance measuring apparatus for measuring distances the basis of interference of reflected light beams reflected by reflecting surfaces.

What is claimed is:

1. A distance measuring apparatus comprising:
    a reflecting mirror which moves in first and second directions that are perpendicular to each other and which has at least one reflecting member extending in said first direction by an amount less than a range within which said reflecting mirror moves in said first direction;
    at least two laser interferometers for irradiating said at least one reflecting member with respective laser beams and measuring distance from said reflecting mirror in said second direction based on reflected laser beams from said at least one reflecting member, said at least two laser interferometers being arranged so that the respective laser beams are separated in said first direction by an interval less than said amount; and
    a selection circuit for selecting an output from one of said laser interferometers as a measurement of distance from said reflecting mirror in said second direction, the selecting being performed while said reflecting mirror is moving and being dependent upon whether or not one of said laser beams is reflected from said at least one reflecting member or more than one of said laser beams are reflected from said at least one reflecting member.

2. A distance measuring apparatus according to claim 1, wherein said selection circuit performs selecting when more than one of said laser beams are reflected from one said reflecting member at the same time.

3. A distance measuring apparatus according to claim 1, wherein said selection circuit also sets a distance measurement result of one of said laser interferometers as a distance measurement result of another of said laser interferometers when an output of said other laser interferometer is selected in place of an output of said one laser interferometer.

4. A distance measuring apparatus according to claim 3, further comprising a correction control circuit which corrects a distance measurement result of said other laser interferometer based on a difference between distance measurement results of said one and said other laser interferometer when said selection circuit selects an output of said other laser interferometer.

5. A distance measuring apparatus according to claim 1, wherein each of said at least two laser interferometers includes a rotation amount detector for irradiating said at least one reflecting member with a plurality of laser beams at the same time and determining a rotation amount of said reflecting mirror based on measurement results obtained from said plurality of laser beams.

6. A distance measuring apparatus comprising:

reflecting means which moves in a first direction and which has two reflecting members, each extending in said first direction by an amount less than a range within which said reflecting means moves in said first direction;

at least two distance measuring means for irradiating said reflecting means with respective light beams and measuring distance from said reflecting means in a second direction perpendicular to said first direction, based on reflected light from said reflecting means, said at least two distance measuring means being arranged so that the respective light beams are separated in said first direction by an interval less than said amount; and selection means for selecting an output from one of said distance measuring means as a measurement of distance from said reflecting means in said second direction, the selecting being performed while said reflecting means is moving and being dependent upon whether or not one of said light beams is reflected from said reflecting means or more than one of said light beams are reflected from said reflecting means, said two reflecting members each extending in said first direction by an amount greater than an interval between two of said light beams and separated by an interval narrower than said interval between said two light beams, whereby at least one of said two light beams always irradiates one of said two reflecting members while said reflecting means is moving in said first direction within said range.

7. A distance measuring apparatus according to claim 6, wherein said selection means performs selecting when one of said two light beams is reflected from one of said two reflecting members and the other of said two light beams is reflected from the other of said two reflecting members and also performs selecting when both of said two light beams are reflected from one of said two reflecting members.

8. A distance measuring apparatus for measuring distance from a moving object, said object moving in a first direction, said distance from the moving object being measured in a second direction perpendicular to said first direction, said apparatus comprising:

a first reflecting member attached to said moving object and extending in said first direction;

a second reflecting member attached to said moving object and extending in a direction parallel to said first direction, said first and second reflecting members being shifted from each other in a third direction perpendicular to both of said first and second directions;

first distance measuring means for irradiating said first reflecting member with a first light beam and measuring distance from said moving object in said second direction based on reflected light from said first reflecting member;

second distance measuring means for irradiating said second reflecting member with a second light beam and measuring distance from said moving object in said second direction based on reflected light from said second reflecting member, said first and second light beams being separated from each other in said third direction;

wherein said first and second reflecting members are arranged so that a state in which said first and second light beams irradiate said first and second reflecting members, respectively, and a state in which only one of said light beams irradiates one of said reflecting members, occur alternately while said object is moving in said first direction; and selection means for selecting an output from one of said first and second distance measuring means as a measurement of distance from said object in said second direction, the selecting being performed while said object is moving and being dependent upon whether or not one of said first and second light beams is reflected from one of said reflecting members or said first and second light beams are reflected from said first and second reflecting members, respectively, at the same time.

9. A distance measuring apparatus according to claim 8, wherein said first and second reflecting members overlap and said selection means performs selecting when said first and second light beams are reflected from said first and second reflecting members, respectively, at the same time.

10. A distance measuring apparatus according to claim 8, wherein said selection means also sets a distance measurement result of one of said first and second distance measuring means as a distance measurement result of the other of said first and second distance measuring means when an output of said other distance measuring means is selected in place of an output of said one distance measuring means.

11. A distance measuring apparatus according to claim 10, further comprising correction control means which corrects a distance measurement result of said other distance measuring means based on a difference between distance measurement results of said first and second distance measuring means when said selection means selects an output of said other distance measuring means.

12. A distance measuring apparatus according to claim 8, wherein each of said first and second distance measuring means includes a rotation amount detecting means for irradiating each of said first and second reflecting members, respectively, with a plurality of light beams at the same time and determining a rotation amount of said first and second reflecting members, respectively, based on measurement results obtained from each plurality of light beams, respectively.

* * * * *